United States Patent [19]
Sakamoto et al.

[11] Patent Number: 4,675,629
[45] Date of Patent: Jun. 23, 1987

[54] NOISE FILTER

[75] Inventors: Yukio Sakamoto; Shinichi Madokoro, both of Fukui, Japan

[73] Assignee: Murata Manufacturing Co., Ltd., Japan

[21] Appl. No.: 828,048

[22] Filed: Feb. 11, 1986

[30] Foreign Application Priority Data

Feb. 18, 1985 [JP] Japan .............................. 60-22150[U]

[51] Int. Cl.$^4$ ............................................. H03H 7/01
[52] U.S. Cl. .................................... 333/182; 333/184; 333/185
[58] Field of Search ............... 333/181, 182, 183, 185, 333/167, 168, 184; 339/143 R, 147 R, 143 C; 29/592 R

[56] References Cited

U.S. PATENT DOCUMENTS 3,579,156  5/1971  Parfitt .................................. 333/167
4,329,665  5/1982  Kawai et al. ......................... 333/182

Primary Examiner—Eugene R. LaRoche
Assistant Examiner—Seung Ham
Attorney, Agent, or Firm—Ostrolenk, Faber, Gerb & Soffen

[57] ABSTRACT

A noise filter wherein a glass plate is fixedly provided in hermetic condition in a metal casing through which a central conductive member passes, a magnetic core is inserted into said central conductive member at one side of said glass plate, a pair of capacitors are respectively passing through the central conductive member at the side of said magnetic core and at the other side of said glass plate, and an insulative resin is filled at least in the opening side of the metal casing.

1 Claim, 6 Drawing Figures

NOISE FILTER

BACKGROUND OF THE INVENTION

The present invention generally relates to a noise filter and more particularly, to a noise filter of hermetic type suitable for bringing the whole of a circuit block into hermetic condition.

Generally, in a high frequency circuit, each block of circuits is shielded by covering with the use of a shield case, and a noise filter is used for a power source, input or output lines, etc. to be connected to the block of circuits, such that the circuits are prevented from mutual interference therebetween. Particularly, in the case where high reliability such as wet-proof characteristic or the like is required, a noise filter of hermetic type is employed such that the shielded block of circuits is wholly brought into airtight condition.

For example, as shown in FIG. 2, a noise filter 1 of hermetic type which is employed for the purpose as described above is installed in a shield box 4 accommodating therein a circuit board 3 which loads electronic components 2 such as a transistor, etc., such that the interior of the shield box 4 becomes airtight.

The prior art noise filter of the type referred to above has the construction as shown in FIG. 1.

More specifically, a metal casing 5 opening at opposite ends thereof has an engagement portion 6 formed at the outer perripheral surface of one end portion thereof, and a glass plate 7 secured to the inner face of the other end portion thereof in hermetic condition. A central conductive member 8 having a predetermined length longer than that of the metal casing 5 is fixedly inserted through the glass plate 7. The glass plate 7 of this kind is generally colored and not transparent, or is hardly seen through by the strain inside the glass or the unevenness of the surface of the glass. A first capacitor 9 having a through-hole is provided at one side of the glass plate 7 inside the metal casing 5 such that the central conductive member 8 pierces the capacitor 9. A pair of the electrodes of the first capacitor 9 are fixedly connected to the conductive member 8 and the metal casing 5, respectively, by soldering. At one side of the first capacitor 9 in the metal casing 5 is inserted a ferrite bead 10 with a through-hole through the conductive member 8, which may be fixed by a bonding agent or the like upon necessity. Further, at one side of the ferrite bead 10 remote from the first capacitor 9 in the metal casing 5 is provided a second capacitor 11, through which the central conductive member 8 passes. The second capacitor 11 also has a through-hole. A pair of the electrodes of the second capacitor 11 are respectively fixedly connected to the conductive member 8 and the metal casing 5 by soldering. At the same time, a space formed between the second capacitor 11 and the opening side of the metal casing 5 is filled with an insulative resin 12.

In the noise filter having the construction as described above, it is necessary to confirm by one's eyes the condition how the first and second capacitors 9 and 11 are fixed to the metal casing 5 and the central conductive member 8 by soldering, so as to obtain high reliability.

However, in order to make sure the condition of the soldering by one's eyes in the prior art noise filter, since there is fixedly provided the glass plate 7 at the inner face of the other end portion of the metal casing 5, the confirmation should be carried out twice, namely, first before the ferrite bead 10 is inserted, with the first capacitor 9 being soldered, and second before the insulative resin 12 is filled in, with the second capacitor 11 being soldered, which therefore gives rise to a problem in realization of mass production of the noise filter. Moreover, in the case where the second capacitor 11 is soldered after the first capacitor 9 is soldered in the same manner as described hereinabove, the solder for fixing the first capacitor 9 is melted by the heat generated at the soldering time of the second capacitor 11, resulting in diffusion of the electrodes of the first capacitor 9 during the soldering. Therefore, it is inconvenient that the capacity of the circuit is decreased, with reliability becoming unstable.

For solving the aforementioned problem, it may be proposed that the first and the second capacitors 9 and 11 are soldered simultaneously. However, this proposal is also disadvantageous in reliability since the condition of the soldering of the first capacitor 9 cannot be confirmed by one's eyes because of its construction.

SUMMARY OF THE INVENTION

Accordingly, the present invention has for its essential object to provide an improved noise filter high in reliability and suitable for mass-production, with substantial elimination of the disadvantage or inconvenience inherent in the prior art noise filter.

In accomplishing this and other objects, according to the present invention, there is provided an improved noise filter which comprises a metal casing opening at opposite ends thereof, a central conductive member, a glass plate fixedly provided in hermetic condition in said metal casing through which said central conductive member passes, a magnetic core having a through-hole inserted into said central conductive member at one side of said glass plate, a pair of capacitors each having a through-hole and respectively passing through the central conductive member at the side of said magnetic core and the central conductive member at the other side of said glass plate, with respective electrodes being fixedly connected to the central conductive member and the metal casing, and an insulative resin filled at least in the opening side of the metal casing.

BRIEF DESCRIPTION OF THE DRAWINGS

This and other objects and features of the present invention will become apparent from the following description taken in conjunction with one preferred embodiment thereof with reference to the accompanying drawings, in which.

DETAILED DESCRIPTION OF THE INVENTION

Figure 1:
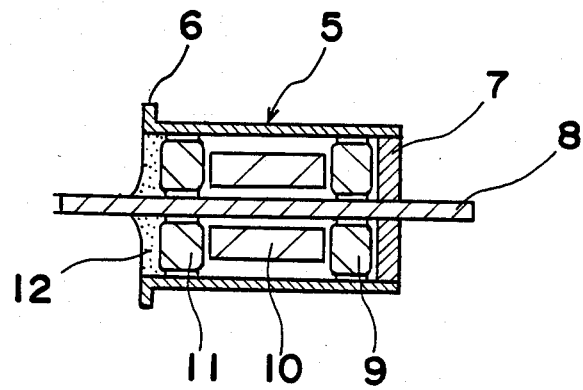
FIG. 1 is a vertical cross sectional view of a prior art noise filter.
Figure 2:
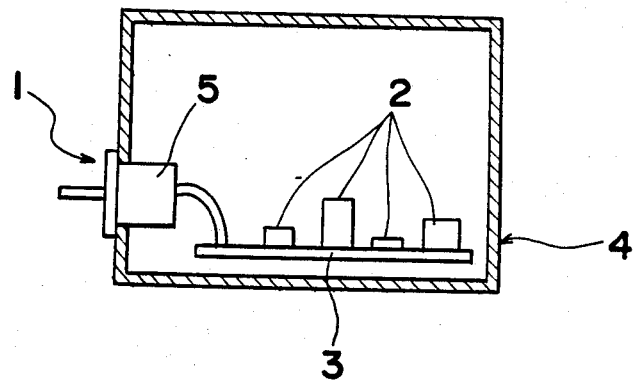
FIG. 2 is a vertical cross sectional view showing one example how the noise filter of FIG. 1 is used.

Before the description of the present invention proceeds, it is to be noted that like parts are designated by like reference numerals throughout the accompanying drawings.

Figure 3:
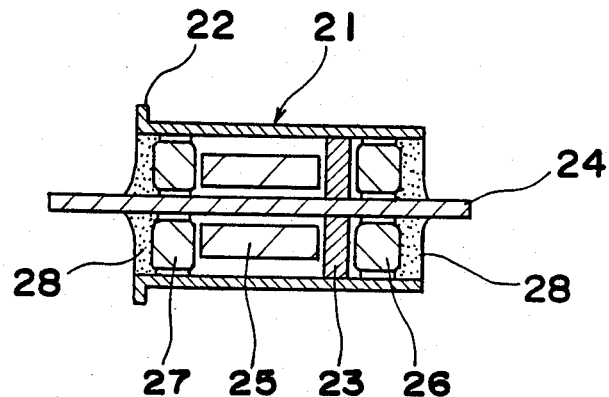
FIG. 3 is a vertical cross sectional view of a noise filter of hemetic type according to one preferred embodiment of the present invention.

Referring now to FIG. 3, showinga vertical cross sectional view of a noise filter of hermetic type according to one preferred embodiment of the present invention, a metal casing 21 has an engagement portion 22 formed in the outer peripheral surface at one side thereof. A plate 23 made of glass is provided at a given position within the metal casing 21, which is formed, for example, by pouring melted glass into the position. A conductive member 24 having a predetermined length longer than that of the metal casing 21 is provided at the center of the metal casing 21 so as to go through the glass plate 23. A core 25 of magnetic material such as ferrite bead or the like has a through-hole formed approximately at the central portion thereof, and is inserted through the central conductive member 24. The magnetic core 25 is placed at one side of the glass plate 23 within the metal casing 21. Moreover, this ferrite bead 25 is secured to the central conductive member 24, upon necessity, by a bonding agent, etc. A first capacitor 26 having a through-hole at the central portion thereof is formed with one electrode at the inner peripheral surface of the through-hole and the other electrode at the outer peripheral surface thereof. The first capacitor 26 is also inserted through the central conductive member 24, with a pair of the electrodes being respectively fixedly connected to the central conductive member 24 and the metal casing 21 by soldering, at the other side of the glass plate 23 remote from the magnetic core 25 within the metal casing 21. In the meantime, a second capacitor 27 having a through-hole at the central portion thereof is formed with one electrode at the inner peripheral surface of the through-hole and the other electrode at the outer peripheral surface thereof. The second capacitor 27 is inserted through the central conductive member 24, with the pair of the electrodes thereof being fixedly connected to the central conductive member 24 and the metal casing 21 by soldering, respectively, at the side of the magnetic core 25 within the metal casing 21. An insulative resin 28 is filled in the opposite opening sides of the metal casing 21. This insulative resin 28 may be inserted into the side of the magnetic core 25 through a space between the second capacitor 27 and, the central conductive member 24 or the metal casing 21.

Figure 4:
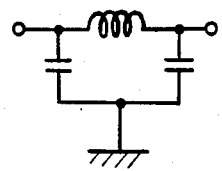
FIG. 4 is an equivalent circuit diagram of the noise filter of FIG. 3.
Figure 5:
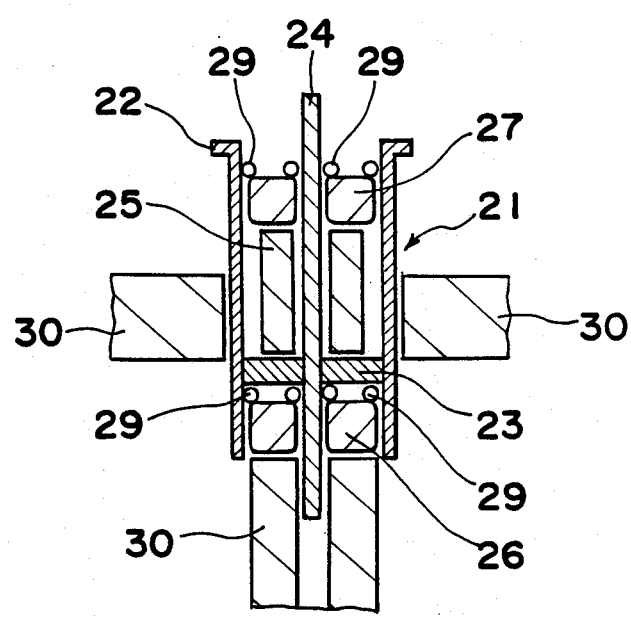
FIG. 5 is a vertical cross sectional view showing one example how the noise filter of FIG. 3 is constructed.

The noise filter of hermetic type having the construction according to the preferred embodiment of the present invention forms an equivalent circuit as shown in FIG. 4.

When the first and the second capacitors 26 and 27 are to be fixed by soldering, ring-shaped solders 29 are placed at the outer peripheral surface of the central conductive member 24 and the inner peripheral surface of the metal casing 21 to which both capacitors 26 and 27 are fixed through the respective electrodes, with the metal casing 21 being placed straight, as shown in FIG. 3. Then, by heating the ring-shaped solders 29 under the condition as above while the metal casing 21, the first capacitor 26, etc. are being supported by a jig 30, it becomes possible that the capacitors 26 and 27 are simultaneously fixed through one single operation.

It is needless to say that the noise filter of the present invention is not limited to the aforementioned embodiment, but may be modified variously within the scope of the invention.

Figure 6:
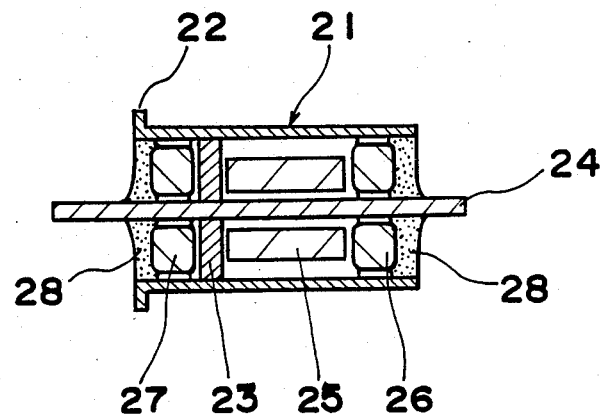
FIG. 6 is a vertical cross sectional view of a noise filter according to another embodiment of the present invention.

For example, the glass plate 23 may be fixedly sandwiched, as shown in FIG. 6, between the second capacitor 27 and the ferrite bead 25.

Furthermore, means to fix the capacitors is not restricted to the solder, but it may be a conductive bonding agent or the like.

As is clear from the foregoing description, in accordance with the noise filter of the present invention, since the first and the second capacitors are provided within the metal casing in such a manner as to sandwich the glass plate therebetween, it becomes possible to see the condition by one's eyes how they are fixed even when they are fixed simultaneously at one time by soldering or the like. Therefore, the noise filter of the present invention is advantageous in that it is highly reliable and suitable for mass-production.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A noise filter which comprises:

a metal casing opening at opposite ends thereof;

a central conductive member to be inserted through said metal casing;

a glass plate through which said central conductive member passes and which is provided at a predetermined position within said metal casing in hermetic condition;

a magnetic core provided at a given position at one side of said glass plate within said metal casing, through which said central conductive member passes;

a first capacitor having a pair of electrodes provided at a given position at the side of said magnetic core within said metal casing, through which said central conductive member passes, said pair of electrodes respectively fixedly connected to said central conductive member and said metal casing;

a second capacitor having a pair of electrodes provided at a given position at the other side of said glass plate remote from said magnetic core within said metal casing, through which said central conductive member passes, said pair of electrodes respectively fixedly connected to said central conductive member and said metal casing; and an insulative resin filled at least into the opening side portion of said metal casing.

* * * * *